United States Patent
Tseng et al.

(10) Patent No.: US 7,285,450 B2
(45) Date of Patent: Oct. 23, 2007

(54) METHOD OF FABRICATING NON-VOLATILE MEMORY

(75) Inventors: Wei-Chung Tseng, Hsinchu (TW); Houng-Chi Wei, Hsinchu (TW); Saysamone Pittikoun, Hsinchu County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 29 days.

(21) Appl. No.: 11/306,248

(22) Filed: Dec. 21, 2005

(65) Prior Publication Data

US 2006/0286752 A1 Dec. 21, 2006

(30) Foreign Application Priority Data

Jun. 15, 2005 (TW) .............................. 94119776 A

(51) Int. Cl.
*H01L 21/337* (2006.01)
(52) U.S. Cl. ................. 438/195; 438/279; 257/E21.638
(58) Field of Classification Search ................. 438/195, 438/279; 257/E21.638
See application file for complete search history.

(56) References Cited

U.S. PATENT DOCUMENTS

| | | | |
|---|---|---|---|
| 4,939,690 A | 7/1990 | Momodomi et al. ... | 365/185.17 |
| 5,930,631 A | 7/1999 | Wang et al. ............... | 438/286 |
| 2004/0121548 A1* | 6/2004 | Fishburn et al. ............ | 438/279 |
| 2006/0220097 A1* | 10/2006 | Ogura ........................ | 257/315 |

\* cited by examiner

*Primary Examiner*—Phat X. Cao
(74) *Attorney, Agent, or Firm*—Jiang Chyun IP Office

(57) ABSTRACT

A method of fabricating non-volatile memory is provided. A plurality of first memory cells is formed on the memory cell region of a substrate. Each first memory cell includes a first composite layer, a first gate and a cap layer. There is a gap between two adjacent first memory cells. Then, a plurality of gates is formed in the respective gaps. The gates together with a second composite layer form a plurality of second memory cells. The second memory cells and the first memory cells together constitute a memory cell column. In the meantime, a plurality of gate structures is also formed on the peripheral circuit region. The gates in the gaps and the gates in the peripheral circuit region are formed using the same conductive layers.

20 Claims, 7 Drawing Sheets

METHOD OF FABRICATING NON-VOLATILE MEMORY

CROSS-REFERENCE TO RELATED APPLICATION

This application claims the priority benefit of Taiwan application Ser. No. 94119776, filed on Jun. 15, 2005. All disclosure of the Taiwan application is incorporated herein by reference.

BACKGROUND OF THE INVENTION

1. Field of the Invention

The present invention relates to a method of fabricating memory. More particularly, the present invention relates to a method of fabricating non-volatile memory.

2. Description of the Related Art

Among the non-volatile memory products, electrically erasable and programmable read-only-memory (EEPROM) is a device that allows multiple data entry, reading and erasing operations. In addition, the stored data will be retained even after power to the device is removed. With these advantages, the memory device has been broadly applied in personal computer and electronic equipment.

In U.S. Pat. No. 4,939,690, a flash memory structure having a floating gate and a control gate fabricated using doped polysilicon is provided. To prevent the mis-judgement errors due to the over-erasure of the flash memory in the erasing operation, additional select gates are formed on the sidewalls of the control gates and the floating gates and over the substrate to form the so-called split-gate structure.

Moreover, a charge storage layer sometimes replaces the polysilicon floating gates in the conventional design technique. The charge storage layer is fabricated using silicon nitride, for example. In general, the silicon nitride charge storage layer is sandwiched between a top and a bottom silicon oxide layer to form an oxide/nitride/oxide (ONO) composite layer. A device having this type of structure is often called a silicon/oxide/nitride/oxide/silicon (SONOS) device. In U.S. Pat. No. 5,930,631, a SONOS device having a split-gate structure has been disclosed.

However, the aforementioned SONOS device with split-gate structure needs more memory space because a larger split-gate area is required to accommodate the split gate structure. Therefore, the SONOS device has memory cells with a size much greater than that of the stack gate EEPROM. In other words, it is difficult to increase the level of integration of the SONOS device with split-gate cell structures any further.

SUMMARY OF THE INVENTION

Accordingly, at least one objective of the present invention is to provide a method of fabricating a non-volatile memory capable of increasing the level of integration of memory cells.

At least a second objective of the present invention is to provide a method of fabricating non-volatile memory capable of increasing the memory storage capacity, simplifying the fabricating process and lowering the production cost.

To achieve these and other advantages and in accordance with the purpose of the invention, as embodied and broadly described herein, the invention provides a method of fabricating non-volatile memory. First, a substrate that can be divided into at least a memory cell region and a peripheral circuit region is provided. Then, a plurality of first memory cells is formed on the substrate in the memory cell region. There is a gap between every pair of adjacent first memory cells. Thereafter, a plurality of second composite layers each including a second charge storage layer is formed over the substrate in the memory cell region. After that, a gate dielectric layer is formed on the substrate in the peripheral circuit region. Then, a conductive layer is formed over the substrate to cover the first memory cells and fill up the gaps. A dielectric layer is formed over the conductive layer. Thereafter, a removing step is carried out to remove a portion of the dielectric layer in the peripheral circuit region and remove the dielectric layer and a portion of the conductive layer in the memory cell region to form a plurality of second gates that completely fills the gaps. The second gates and the second composite layers form a plurality of second memory cells. The second memory cells together with the first memory cells form a first memory cell column. Thereafter, the remaining dielectric layer and the second conductive layer in the peripheral circuit region are patterned to form a plurality of gate structures in the peripheral circuit region and remove the dielectric layer and the second conductive layer in the memory cell region. After that, a source/drain region is formed in the substrate on the respective sides of the first memory cell column.

According to the aforementioned method of fabricating non-volatile memory in the embodiment of the present invention, the removing step includes performing a first chemical-mechanical polishing process using the first memory cells as a polishing stop layer.

According to the aforementioned method of fabricating non-volatile memory in the embodiment of the present invention, the removing step includes performing a second chemical-mechanical polishing process to planarize the dielectric layer and performing an etching operation to each the remaining dielectric layer using the first memory cells as an etching stop layer.

According to the aforementioned method of fabricating non-volatile memory in the embodiment of the present invention, the method of forming the second composite layer over the substrate in the memory cell region and the gate dielectric layer over the substrate in the peripheral circuit region includes the following steps. First, a second composite layer is formed over the substrate. Then, a patterned photoresist layer is formed to cover the second composite layer in the memory cell region. Using the patterned photoresist layer as a mask, the second composite layer in the peripheral circuit region is removed. Thereafter, a gate dielectric layer is formed over the substrate in the peripheral circuit region. Finally, the patterned photoresist layer is removed.

According to the aforementioned method of fabricating non-volatile memory in the embodiment of the present invention, before forming the second composite layers, spacers are formed on the sidewalls of the first memory cells.

According to the aforementioned method of fabricating non-volatile memory in the embodiment of the present invention, after forming the first memory cells but before forming the spacers, further includes forming a liner oxide layer on the respective sidewalls of the first memory cells.

According to the aforementioned method of fabricating non-volatile memory in the embodiment of the present invention, the process of forming the liner oxide layer further includes performing a rapid thermal oxidation.

According to the aforementioned method of fabricating non-volatile memory in the embodiment of the present invention, the method of forming source/drain regions in the substrate includes performing an ion implantation process.

According to the aforementioned method of fabricating non-volatile memory in the embodiment of the present invention, the method further includes forming a second memory cell column on the substrate next to the first memory cell column.

According to the aforementioned method of fabricating non-volatile memory in the embodiment of the present invention, the distance between the first memory cell column and the second memory cell column is wider than the gap between two adjacent first memory cells.

According to the aforementioned method of fabricating non-volatile memory in the embodiment of the present invention, one of the source/drain regions is formed in the substrate between the first memory cell column and the second memory cell column.

According to the aforementioned method of fabricating non-volatile memory in the embodiment of the present invention, the width of the two outermost first memory cells is larger than the other first memory cells.

According to the aforementioned method of fabricating non-volatile memory in the embodiment of the present invention, the dielectric layer has a thickness about 3000Å.

According to the aforementioned method of fabricating non-volatile memory in the embodiment of the present invention, each first memory cell includes, from the substrate level up, a first composite layer, a first gate and a cap layer. The first composite layer includes a first charge storage layer.

According to the aforementioned method of fabricating non-volatile memory in the embodiment of the present invention, the material constituting the first gates includes doped polysilicon or polysilicon silicide (or polycide).

According to the aforementioned method of fabricating non-volatile memory in the embodiment of the present invention, the material constituting the first charge storage layer and the second charge storage layer includes silicon nitride or doped polysilicon.

According to the aforementioned method of fabricating non-volatile memory in the embodiment of the present invention, the cap layer includes a silicon oxide layer, a silicon nitride layer or a stack layer including a silicon oxide layer and a silicon nitride layer.

According to the aforementioned method of fabricating non-volatile memory in the embodiment of the present invention, each first composite layer and second composite layer includes a bottom dielectric layer and a top dielectric layer.

According to the aforementioned method of fabricating non-volatile memory in the embodiment of the present invention, the material constituting the bottom dielectric layer and the top dielectric layer includes silicon oxide.

According to the aforementioned method of fabricating non-volatile memory in the embodiment of the present invention, the method of patterning the dielectric layer includes performing an anisotropic etching operation.

In the method of fabricating non-volatile memory according to the present invention, a second composite layer and a conductive layer are formed in the gap between the stack gate structures. Because there is no need to perform photolithographic and etching processes to produce another type of gate structures between the stack gate structures, high-density memory cells are produced. Furthermore, the fabrication process is simpler so that the production cost can be reduced.

In addition, the process of fabricating the second gates in the memory cell region and the process of fabricating the gate structures in the peripheral circuit region can be integrated to simplify the operation. Furthermore, the second gate in the memory cell region and the gate structures in the peripheral circuit region are formed using the same conductive layer. Hence, the production cost can be effectively reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
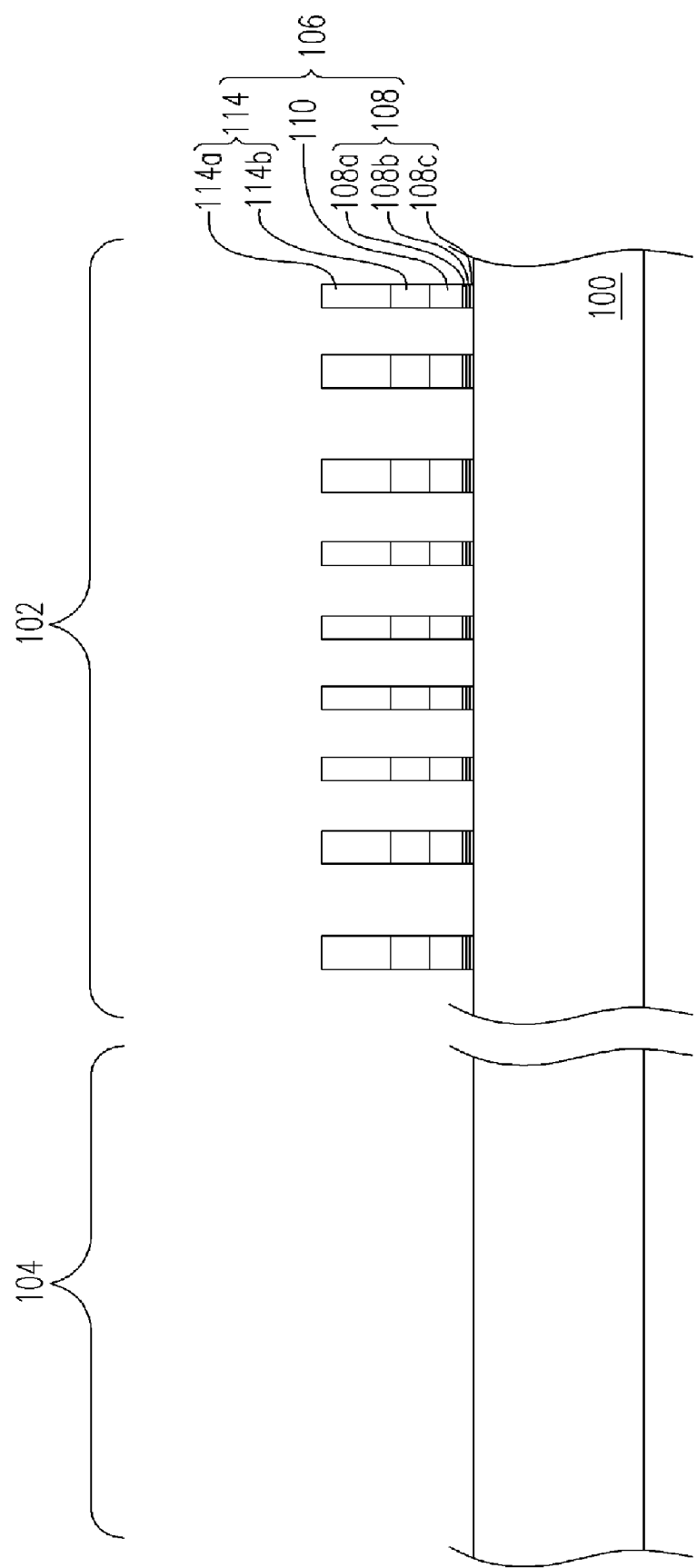
FIGS. 1A through 1G are schematic cross-sectional views showing the steps for fabricating a non-volatile memory according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1G are schematic cross-sectional views showing the steps for fabricating a non-volatile memory according to one embodiment of the present invention. First, as shown in FIG. 1A, a substrate 100 such as a silicon substrate is provided. The substrate 100 can be divided at least into a memory cell region 102 and a peripheral circuit region 104. Then, a plurality of memory cells 106 is formed over the substrate 100 in the memory cell region 102. Each memory cell 106 includes a composite layer 108, a gate 110 and a cap layer 114. The method of forming the memory cells 106 includes sequentially forming a composite dielectric material layer, a conductive layer and an insulating material layer over the substrate 100. Then, a patterned photoresist layer (not shown) is formed over the memory cell region 102. Thereafter, an etching operation is carried out to pattern the material layer in the memory cell region 102 and remove the material layer in the peripheral circuit region 104 simultaneously. Finally, the patterned photoresist layer is removed.

It should be noted that, in the subsequent process of forming various memory cell columns, the width of the two outermost memory cells 106 is greater than the width of the other memory cells 106 in the memory cell column. This prevents the doping range of the subsequently formed source/drain regions from exceeding the outermost memory cells 106 of the memory cell column and leading to defects in electrical performance.

Each composite layer 108 includes a bottom dielectric layer 108a, a charge storage layer 108b and a top dielectric layer 108c. The bottom dielectric layer 108a is a silicon oxide formed, for example, by performing a thermal oxidation process. The charge storage layer 108b is a silicon nitride layer or a doped polysilicon layer formed, for example, by performing a chemical vapor deposition process. The top dielectric layer 108c is another silicon oxide layer formed, for example, by performing a chemical vapor deposition process. Obviously, the bottom dielectric layer 108a and the top dielectric layer 108c can be fabricated using other materials. In addition, the material constituting the charge storage layer 108b is also not limited to silicon nitride or doped polysilicon. Other material capable of trapping electric charges including, for example, tantalum oxide, strontium titanate and hafnium oxide, can be used.

The gates 110 are fabricated using doped polysilicon, for example. The method of forming the gates 110 includes depositing undoped polysilicon material to form an undoped polysilicon layer in a chemical vapor deposition process and performing an ion implantation process thereafter. In another embodiment, the gates 110 can be a polysilicon silicide (polycide) including a doped polysilicon layer and a silicide layer, for example. The polycide layer is formed, for example, by depositing doped polysilicon material to form a doped polysilicon layer and performing a chemical vapor deposition process to form a silicide layer thereafter. The material constituting the silicide layer may include nickel silicide or tungsten silicide, for example.

The cap layer 114 can be a silicon oxide layer, a silicon nitride layer or a stacked layer including a silicon oxide layer and a silicon nitride layer. In the present embodiment, the cap layer 114 is a stack layer including a silicon oxide layer 114b and a silicon nitride layer 114a, for example. The silicon nitride layer 114a can serve as a hard mask layer. The method of forming the cap layer 114 includes depositing silicon oxide using tetra-ethyl-ortho-silicate (TEOS)/ozone ($O_3$) as reactive gases in a chemical vapor deposition process to form the silicon oxide layer 114b. Thereafter, silicon nitride material is disposed over the silicon oxide layer 114b to form the silicon nitride layer 114a in a chemical vapor deposition process.

Figure 1B:
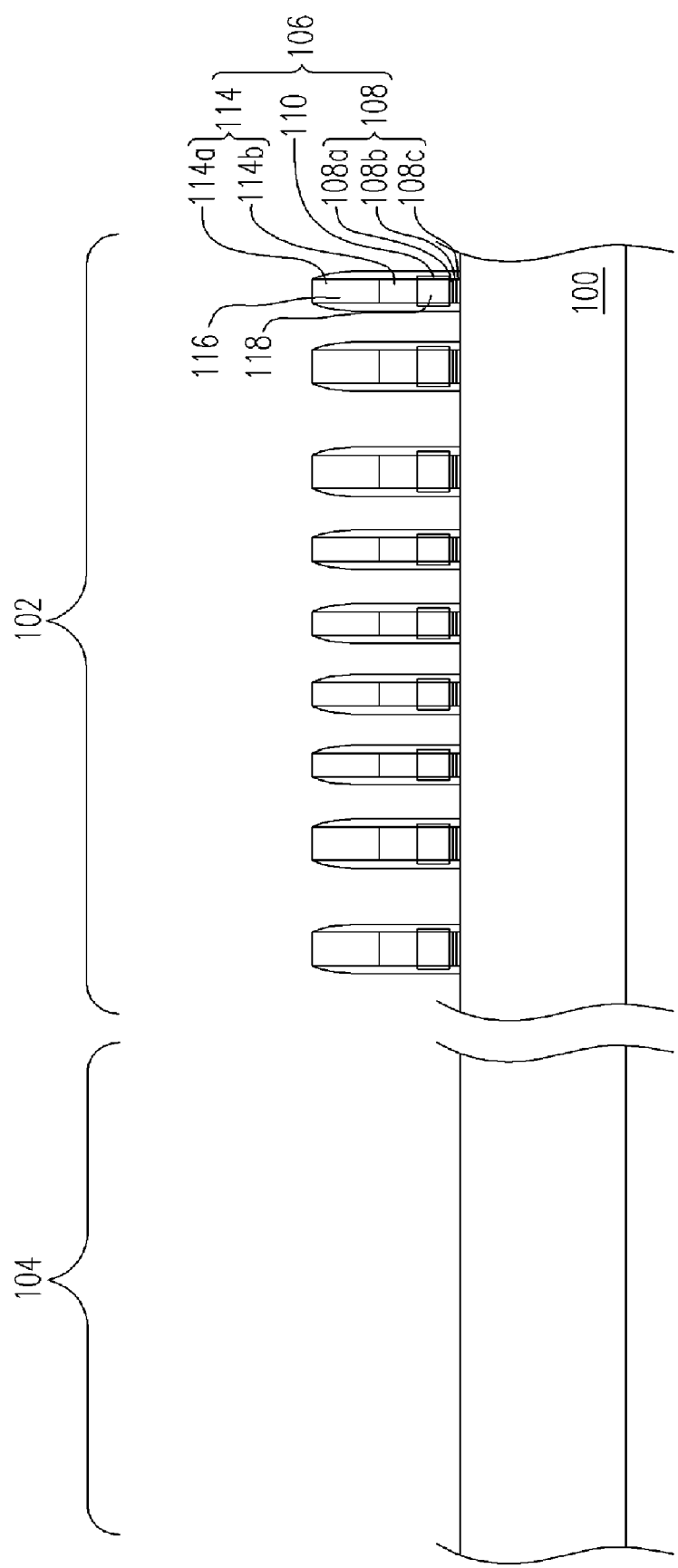

As shown in FIG. 1B, spacers 116 are formed on the respective sidewalls of the memory cells 106. The spacers 116 are formed, for example, by depositing insulating material to form an insulating material layer and then performing an anisotropic etching operation to remove the insulating material layer so that only a portion of the insulating material layer is retained on the sidewalls of the memory cells 106. The material constituting the spacers 116 includes silicon nitride, for example. In another embodiment, a rapid thermal annealing process is also carried out after forming the memory cells 106 but before forming the spacers so that a liner oxide layer 118 is formed on the sidewalls of the gates 110 and the silicide layer 112.

Figure 1C:
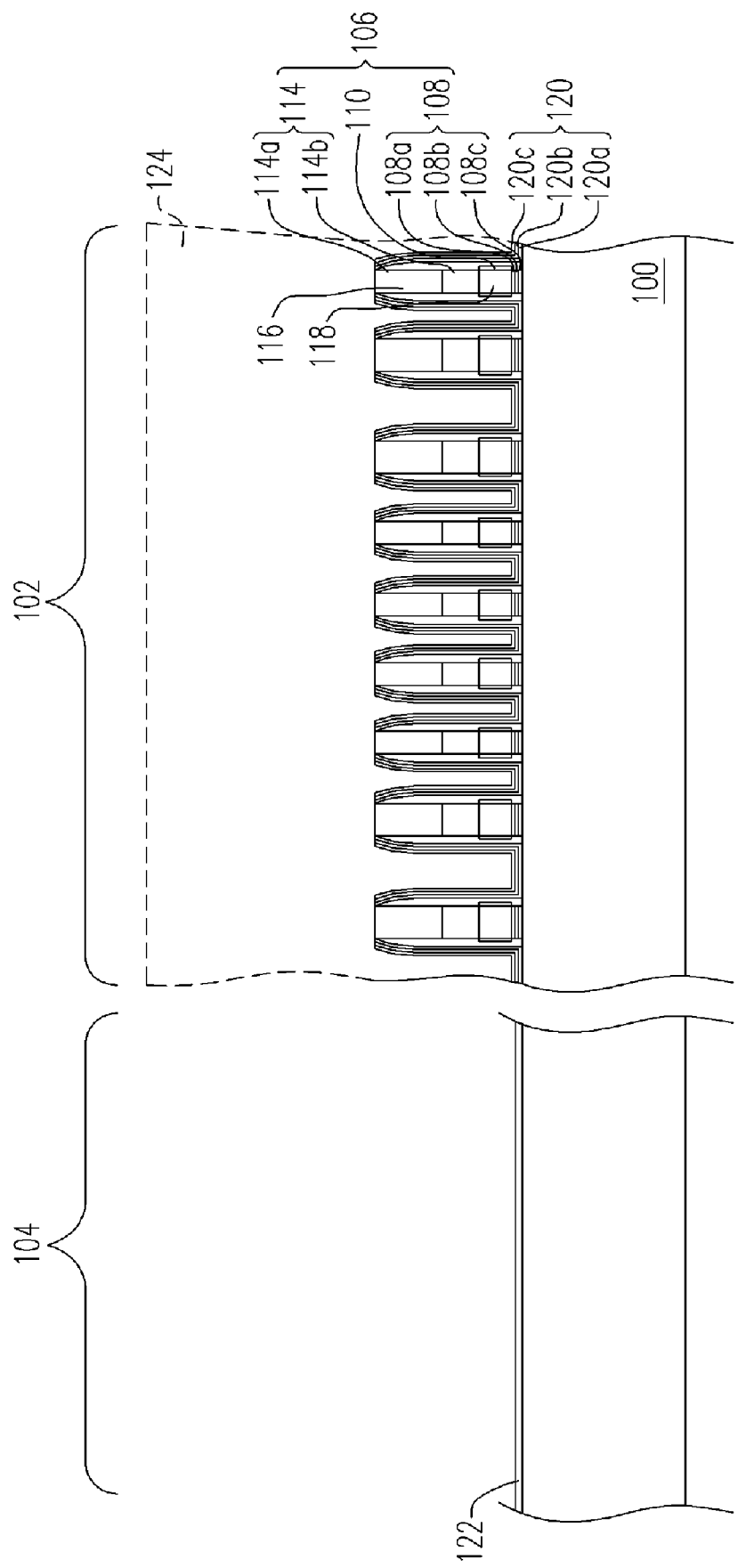

As shown in FIG. 1C, another composite layer 120 is formed over the substrate 100 in the memory cell region 102 and a gate dielectric layer 122 is formed over the substrate 100 in the peripheral circuit region 104. The method of forming the composite layer 120 in the memory cell region 102 and the gate dielectric layer 122 in the peripheral circuit region 104 includes the following steps. First, a composite layer 120 is formed over the substrate 100. Then, a patterned photoresist layer 124 is formed to cover the composite layer 120 in the memory cell region 102. Using the patterned photoresist layer 124 as a mask, the composite layer 120 in the peripheral circuit region 104 is removed, for example, by performing an anisotropic etching operation. Thereafter, a gate dielectric layer 122 is formed over the substrate in the peripheral circuit region 104, for example, by performing a thermal oxidation process. Finally, the patterned photoresist layer 124 is removed.

The composite layer 120 includes, for example, a bottom dielectric layer 120a, a charge storage layer 120b and a top dielectric layer 120c. Since the material constituting the composite layer 120 and the method of forming the composite layer 120 are similar to the composite layer 108, a detailed description is omitted.

Figure 1D:
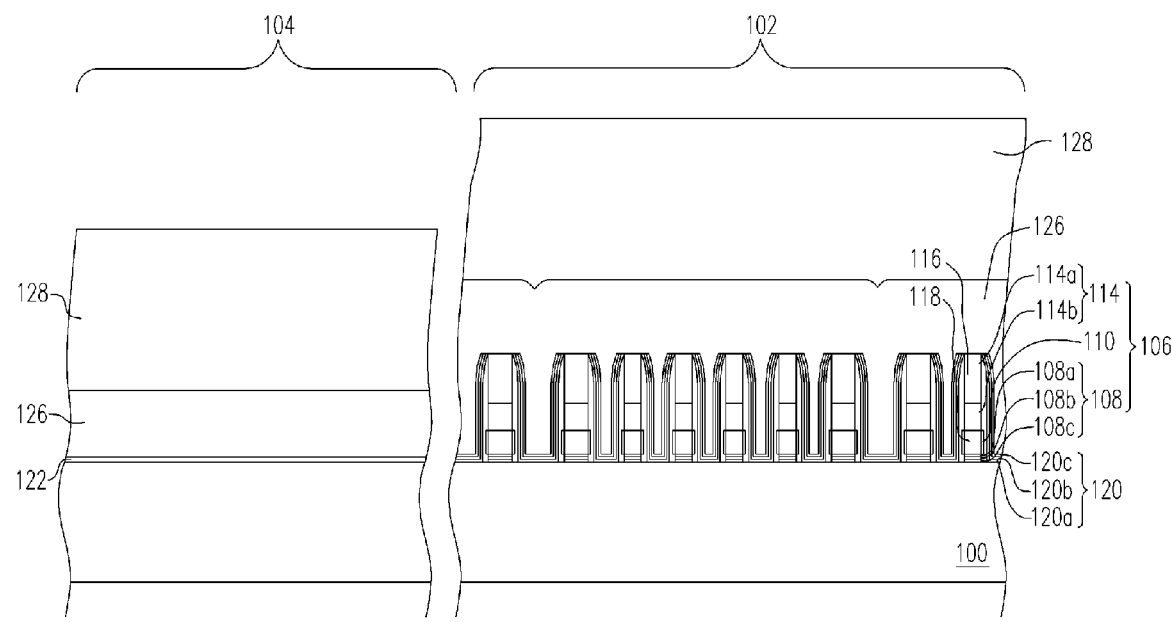

As shown in FIG. 1D, a conductive layer 126 is formed over the substrate 100 to fill the gaps between adjacent memory cells 106. The conductive layer 126 is fabricated using doped polysilicon, for example. The conductive layer 122 is formed, for example, by depositing undoped polysilicon in a chemical vapor deposition process to form an undoped polysilicon layer and performing an ion implantation process thereafter.

Thereafter, a dielectric layer 128 is formed over the conductive layer 126. The dielectric layer 128 is formed, for example, by performing a chemical vapor deposition process using tetra-ethyl-ortho-silicate (TEOS)/ozone ($O_3$) as reactive gases.

Figure 1E:
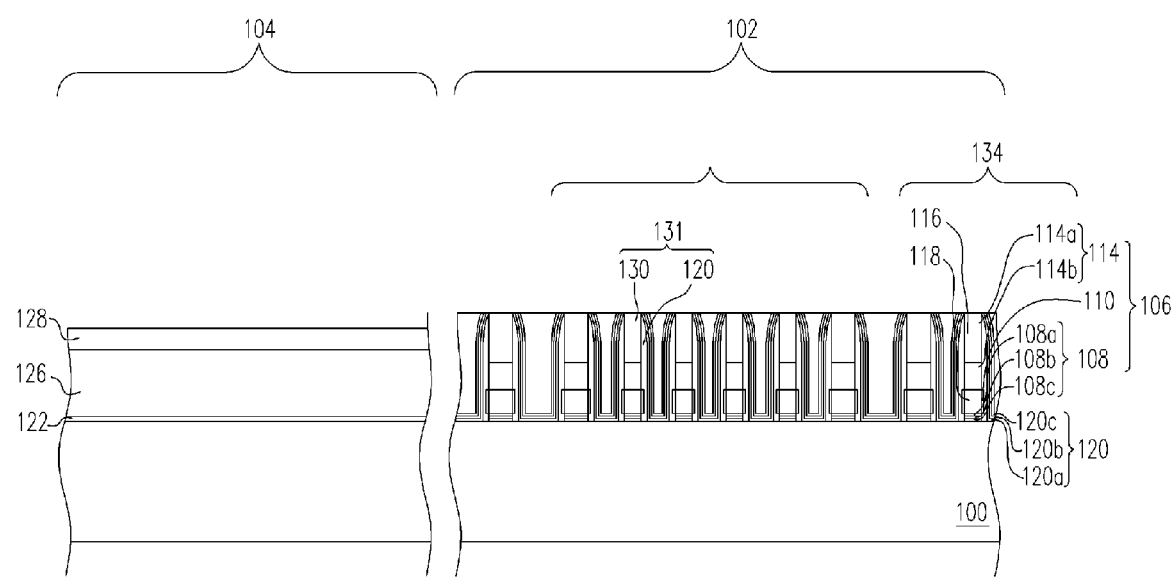

As shown in FIG. 1E, a removing step such as a chemical-mechanical polishing process is carried out to planarize the dielectric layer 128. Then, another removing step, for example, an etching operation is carried out using the cap layer 114 as an etching stop layer to remove a portion of the dielectric layer 128 in the peripheral circuit region 104 and the dielectric layer 128 and a portion of the conductive layer 126 in the memory cell region 102. Thus, the upper surface of the memory cells 106 are exposed and a plurality of gates 130 that completely fills the gaps are formed. The dielectric layer 128 has a thickness of about 5000Å, for example.

In another embodiment, a removing step is directly carried out to remove a portion of the dielectric layer 128 in the peripheral circuit region 104 and the dielectric layer 128 and a portion of the conductive layer 126 in the memory cell region 102. The removing step includes performing a chemical-mechanical polishing process using the cap layer 114 as a polishing stop layer. Thus, the upper surface of the memory cells 106 is exposed and a plurality of gates 130 that fills the caps are formed. The dielectric layer 128 has a thickness of about 3000Å, for example.

After performing the aforementioned removing steps, the gates 130 and the composite layers 120 together form a plurality of memory cells 131.

The gates 130 formed in the above method has a planar surface. Moreover, the profile is easier to control so that the limitations on the layout of the memory cell array are reduced. Furthermore, forming the dielectric layer 128 over the conductive layer 126 is able to protect the conductive layer 126 in the peripheral circuit region 104 against damages due to removing the dielectric layer 128 and a portion of the conductive layer 126 from the memory cell region 102.

The aforementioned memory cells 131 and the memory cells 106 can form a plurality of memory cell columns. In the present embodiment, only the memory cell columns 132 and 134 are shown for further description. The separation between the memory cell column 132 and the memory cell column 134 is greater than the separation between adjacent memory cells 106. This greater distance of separation facilitates the formation of plugs in a subsequent interconnect fabrication process.

Figure 1F:
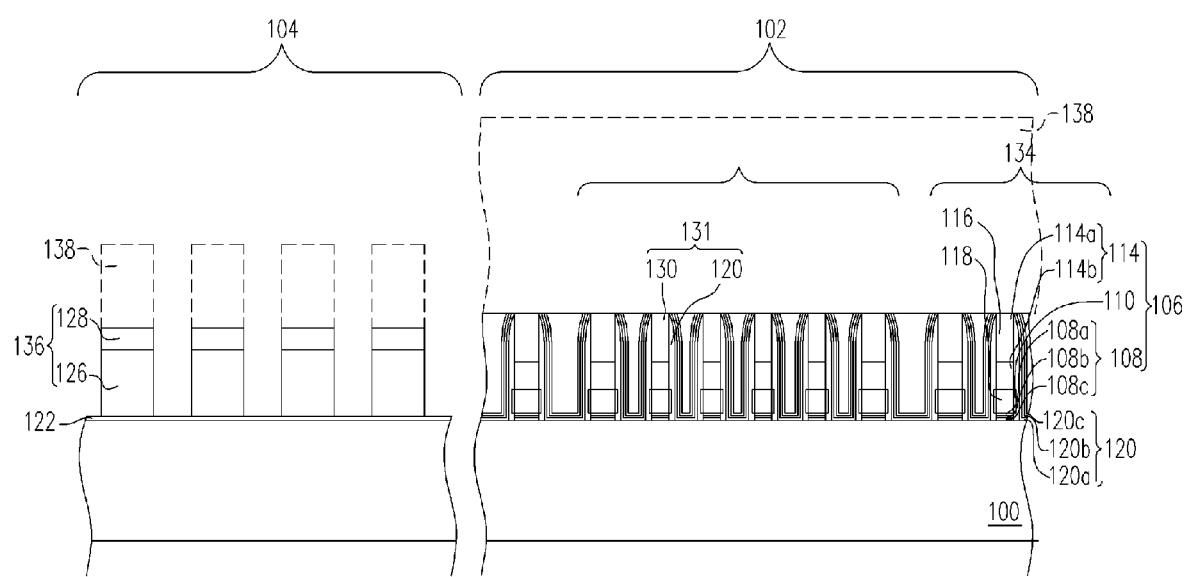

As shown in FIG. 1F, the dielectric layer 128 and the conductive layer 126 in the peripheral circuit region 104 are patterned to form a plurality of gate structures 136. The patterning process includes the following steps. First, a patterned photoresist layer 138 is formed to cover the memory cell region 102 and expose a portion of the dielectric layer 128 in the peripheral circuit region 104. Thereafter, a portion of the dielectric layer 128 and the conductive layer 126 are removed to form the gate structures 136. The method of removing the dielectric layer 128 and the conductive layer 126 includes performing an anisotropic etching operation, for example. Finally, the patterned photoresist layer 138 is removed.

Figure 1G:
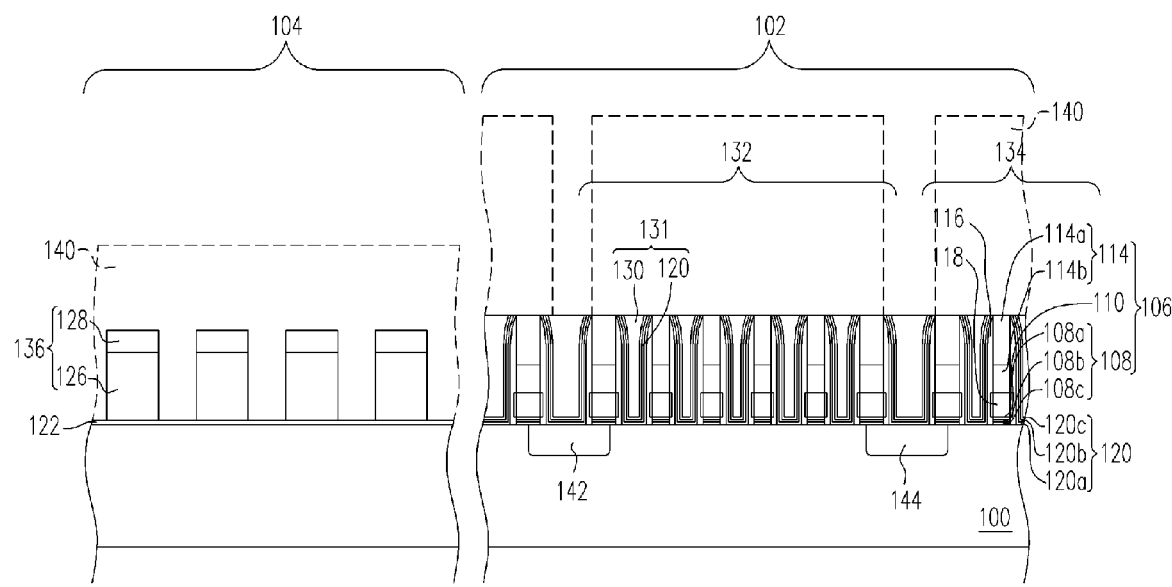

As shown in FIG. 1G, another patterned photoresist layer 140 is formed over the substrate 100 to expose the areas for forming source/drain regions. Thereafter, an etching operation is carried out to remove the gate 130 and the composite layer 108 above the areas for forming the source/drain regions.

Then, using the patterned photoresist layer 140 as a mask, a dopant implantation operation is carried out to form a source region 142 and a drain region 144 in the substrate 100 on the respective sides of the memory cell column. In other words, the source region 142 and the drain region 144 are disposed in the substrate 100 between two adjacent memory cell columns. Thereafter, the patterned photoresist layer 140 is removed. Since the subsequent processes for forming a complete non-volatile memory should be familiar to those skilled in this area, a detailed description is omitted.

In the aforementioned embodiment, the composite layer 120 and the gates 130 are formed in the gaps between the memory cells 106. Hence, gate structures are formed between the memory cells 106 without performing photolithographic and etching processes, thereby increasing the density of the memory cells. Furthermore, the fabricating process is simpler and can reduce production cost.

In addition, the process of fabricating the gates 130 in the memory cell region 102 and the process of fabricating the gate structures 136 in the peripheral circuit region 104 can be integrated to simplify the operation. Furthermore, the gates 130 in the memory cell region 102 and the gate structures 136 in the peripheral circuit region 104 are formed using the same conductive layer 126. Hence, the production cost can be effectively reduced.

In summary, the present invention has at least the following advantages:

1. The method of fabricating non-volatile memory in the present invention allows another type of gate structures to be formed in the gap between the gate structures in the memory cell region so that non-volatile memory can have a higher device packing density.

2. The processes for forming the memory cell region and the peripheral circuit region can be integrated together to simplify the non-volatile memory fabrication process.

3. The width of the two outermost gate structures in the memory cell row is increased to prevent the doping range of the source/drain regions from exceeding the outermost gate structures of the memory cell column and hence minimize defective electrical properties.

4. The surface of the other type of gate structures formed between the gate structures in the memory cell region has a planar surface and its profile is easier to control. Hence, the limitations in the layout of the memory cell array can be reduced.

5. The adjacent memory cell columns in the present invention have a larger separation than the adjacent memory cells to facilitate the formation of plugs in a subsequent interconnect process.

6. By forming a dielectric layer on the conductive layer of the gates in the peripheral circuit region, the conductive layers in the peripheral circuit region are protected against any damage when another gate structures are formed between the gate structures in the memory cell region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating non-volatile memory, comprising the steps of:
   providing a substrate at least divided into a memory cell region and a peripheral circuit region;
   forming a plurality or first memory cells on the substrate in the memory cell region, wherein every pair of adjacent first memory cells has a gap;
   forming a second composite layer over the substrate in the memory cell region, wherein the second composite layer includes a second charge storage layer;
   forming a gate dielectric layer over the substrate in the peripheral circuit region;
   forming a conductive layer over the second composite layer and the gate dielectric layer to cover the first memory cells and fill up the gaps;
   forming a dielectric layer over the conductive layer;
   removing a portion of the dielectric layer in the peripheral circuit region and removing the dielectric layer and a portion of the conductive layer in the memory cell region to form a plurality of second gates that fills the gaps, wherein the second gates and the second composite layer form a plurality of second memory cells, and the second memory cells and the first memory cells form a first memory cell column;
   patterning the remaining dielectric layer and the conductive layer in the peripheral circuit region to form a plurality of gate structures in the peripheral circuit region; and
   forming a source/drain region in the substrate on the respective sides of the first memory cell column.

2. The method of claim 1, wherein the removing step includes performing a first chemical-mechanical polishing process using the first memory cells as a polishing stop layer.

3. The method of claim 1, wherein the removing step further includes:
   performing a second chemical-mechanical polishing process to planarize the dielectric layer; and
   etching the remaining dielectric layer using the first memory cells as an etching stop layer.

4. The method of claim 1, wherein the process of forming the second composite layer over the substrate in the memory cell region and farming the gate dielectric layer over the substrate in the peripheral circuit region includes:
   forming the second composite layer over the substrate;
   forming a patterned photoresist layer to cover the second composite layer in the memory cell region;
   removing the second composite layer in the peripheral circuit region using the patterned photoresist layer as a mask;
   forming the gate dielectric aver the substrate in the peripheral circuit region; and
   removing the patterned photoresist layer.

5. The method of claim 1, wherein before forming the second composite layer, further includes forming spacers on the sidewalls of the first memory cells.

6. The method of claim 5, wherein after forming the first memory cells but before forming the spacers, further includes forming a liner oxide layer on the sidewalls of the first memory cells.

7. The method of claim 6, wherein the process of forming the liner oxide layer further includes performing a rapid thermal annealing process thereafter.

8. The method of claim 1, wherein the stop of forming the source/drain regions in the substrate includes performing an ion implantation process.

9. The method of claim 1, further includes forming a second memory cell column on the substrate next to the first memory cell column.

10. The method of claim 9, wherein a distance between the first memory cell column and the second memory cell column is wider than the gap between any two adjacent first memory cells.

11. The method of claim 9, wherein one of the source/drain regions is formed in the substrate between the first memory cell column and the second memory cell column.

12. The method of claim 1, wherein the width of two outermost first memory cells in the first memory cell column is larger than the other first memory cells.

13. The method of claim 1, wherein the dielectric layer has a thickness of about 3000Å.

14. The method of claim 1, wherein each memory cell comprises, from the substrate, a first composite layer, a first gate and a cap layer such that the first composite layer also includes a first charge storage layer.

15. The method of claim 14, wherein the material constituting the first gates includes doped polysilicon or polysilicon silicide (polycide).

16. The method of claim 14, wherein the material constituting the first charge storage layer and the second charge storage layer includes silicon nitride or doped polysilicon.

17. The method of claim 14, wherein the cap layer includes a silicon oxide layer, a silicon nitride layer or a stacked layer comprising a silicon oxide layer and a silicon nitride layer.

18. The method of claim 14, wherein the first composite layer and the second composite layer each comprises a bottom dielectric layer and a top dielectric layer.

19. The method of claim 18, wherein the material constituting the bottom dielectric layer and the top dielectric layer includes silicon oxide.

20. The method of claim 1, wherein the step of patterning the dielectric layer includes performing an anisotropic etching operation.

* * * * *